(12) United States Patent
Audy

(10) Patent No.: US 6,246,243 B1
(45) Date of Patent: Jun. 12, 2001

(54) SEMI-FUSIBLE LINK SYSTEM

(75) Inventor: Jonathan Audy, San Jose, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/489,100

(22) Filed: Jan. 21, 2000

(51) Int. Cl.[7] .......................... G01R 31/02; G01R 33/00; G01R 31/26; H01H 37/76

(52) U.S. Cl. .......................... 324/550; 324/549; 324/765; 324/766; 327/525; 365/225.7

(58) Field of Search ................... 324/600, 117 R, 324/551, 522, 765, 766, 549, 550, 713, 719; 327/525; 341/118; 714/732; 323/315; 361/18; 365/225.7

(56) References Cited

U.S. PATENT DOCUMENTS

| | | | |
|---|---|---|---|
| 4,038,677 | * 7/1977 | Nagel et al. | 257/529 |
| 4,138,671 | * 2/1979 | Comer et al. | 341/121 |
| 4,516,182 | * 5/1985 | Franklin | 361/13 |
| 4,605,872 | * 8/1986 | Rung | 327/525 |
| 4,625,162 | * 11/1986 | Bosnyak | 324/551 |
| 4,674,180 | * 6/1987 | Zavracky et al. | 29/622 |
| 4,760,791 | * 8/1988 | Bock | 102/200 |
| 4,777,471 | * 10/1988 | Comer | 341/118 |
| 5,469,379 | * 11/1995 | Levy | 365/96 |
| 5,731,733 | * 3/1998 | Denham | 327/525 |
| 5,757,175 | * 5/1998 | Morishita et al. | 323/315 |
| 5,768,290 | * 6/1998 | Akamatsu | 714/732 |
| 5,789,970 | * 8/1998 | Denham | 327/525 |
| 5,969,403 | * 10/1999 | Fournel et al. | 257/529 |
| 5,983,718 | * 11/1999 | Wyse et al. | 73/504.12 |
| 6,037,831 | * 3/2000 | Watrobski et al. | 327/525 |
| 6,108,260 | * 6/1998 | Casper | 365/225.7 |

* cited by examiner

Primary Examiner—Glenn W. Brown
Assistant Examiner—Wasseem H. Hamdan
(74) Attorney, Agent, or Firm—Koppel & Jacobs

(57) ABSTRACT

A programmable "semi-fusible" link system is used to trim one or more circuit parameters. Each semi-fusible link, typically a thin film resistor, has "intact" and "blown" states, with the link having a first, non-zero resistance when intact, and a second, higher but finite resistance when blown, which is accomplished by forcing a predetermined current through the link. Each link is connected to a respective active devices which, when turned on, provide the current needed to blow the link. The links are also connected in series with respective current sources, and to respective threshold detectors connected to monitor the current through their respective links. Each threshold detector provides a logic output which indicates whether its link is intact or blown based on the magnitude of the link current. A "disable" circuit may also be included which, when activated, prevents the further programming of any of the circuit's semi-fusible links.

18 Claims, 4 Drawing Sheets

SEMI-FUSIBLE LINK SYSTEM

BACKGROUND OF THE INVENTION

1. Field of the Invention

This invention relates to the field of semi-fusible links, and particularly to semi-fusible link systems used for parameter trimming in integrated circuits.

2. Description of the Related Art

"Fusible links" have been used in integrated circuits (ICs) for many years, as a means of trimming one or more IC parameters. A fusible link is characterized as having "intact" and "blown" states, providing a very low resistance when intact and an open circuit when blown. For example, an operational amplifier's offset voltage might be trimmed using a number of fusible links connected in series with a number of resistors, with the links and resistors arranged such that the resistance between the amplifier's offset input and ground can be adjusted by blowing open the appropriate links.

A number of approaches have been used to create fusible links. For example, an "anti-fuse", i.e., a link that can be driven from an "open" state to a short circuit, is created by forcing a high current through a zener junction to trigger a reverse breakdown, which melts the metal contacts together across the junction to form a short. These "zener zap" links typically operate at 25–35 volts and require currents that would be destructive to a reasonably-sized transistor made with the same process. For this reason, zener zaps are typically programmed using dedicated bond pads for each link.

Minimum width metal tracks have also been used as fusible links, with a current forced through the metal to melt the link open. As with the zener zaps, the high currents required to open such links typically require dedicated bond pads for each link.

Fusible links have also been made from polysilicon ("poly"). Poly links are superior to either zener zaps or metal links in that the power required to blow open a poly link can be provided by an active circuit device, such as a reasonably large n-channel MOSFET. The ability to blow the links with active devices removes the need for the bond pad-per-link requirement, such that many links can be programmed by, for example, a serially-loaded shift register which requires only 2 bond pads. However, poly links do require a considerable amount of chip space to accommodate the large active devices needed to provide the programming current.

In addition to the above-noted problems, the substantial currents (referred to herein as the "programming currents") needed to blow poly, metal, or zener zap links may damage the semiconductor. In particular, a die's thin glass passivation layer, which protects the circuit from mechanical or chemical damage, can rupture or crack during link blowing. This may allow moisture to penetrate to the chip's surface and allow corrosion to begin.

SUMMARY OF THE INVENTION

A programmable "semi-fusible" link system is presented which avoids the difficulties noted above. The system enables a number of links to be programmed without requiring dedicated bond pads, using currents which present little danger to the semiconductor and are generated with active devices of modest size.

As with a conventional link, a semi-fusible link has "intact" and "blown" states. However, while a conventional link is typically shorted when intact and open when blown, a semi-fusible link has a first resistance when intact, and a second, higher resistance when blown, which is accomplished by forcing a predetermined current through the link. A preferred semi-fusible link is a thin film resistor, which, when made as short and thin as practical, has a typical resistance of about 1k–8k Ω when intact and about 20k–80k Ω when blown.

Each of the links in a semi-fusible link system is connected to a respective programming circuit which, when activated, provides the programming current needed to blow the link. The links are also connected in series with respective current sources, and to respective threshold detectors connected to monitor the voltage across their respective links. Each threshold detector provides a logic output which indicates whether its link is intact or blown based on the magnitude of the link voltage. The logic output can then be used to, for example, drive a transistor switch which switches a known resistor into or out of a circuit, or be read out via a bond pad or a serial interface.

A circuit employing the present semi-fusible link system typically includes a number of such link/programming circuit/current source/threshold detector groups, with the current sources activated in turn by a logic decoder which responds to a fuse select signal. A "disable" circuit is also included which is activated when all desired links have been blown, which prevents the occurrence of any additional programming.

Further features and advantages of the invention will be apparent to those skilled in the art from the following detailed description, taken together with the accompanying drawings.

DETAILED DESCRIPTION OF THE INVENTION

Figure 1:
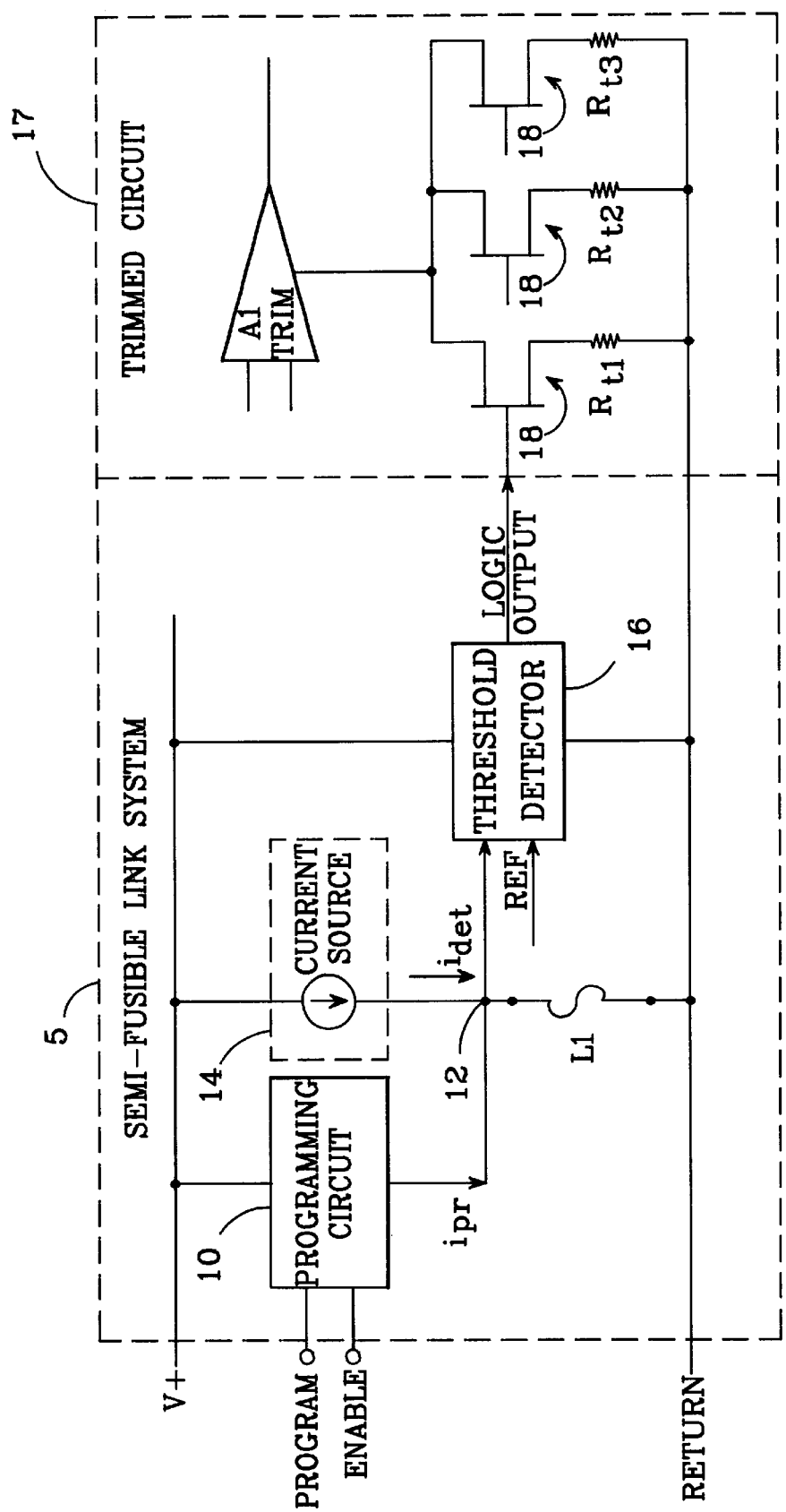
FIG. 1 is a block/schematic diagram illustrating a basic semi-fusible link system per the present invention.

A basic semi-fusible link system 5 is illustrated in FIG. 1. A semi-fusible link L1 is connected in series with a programming circuit 10 at a junction 12, with L1 and circuit 10 connected between a supply voltage V+ and a RETURN line (typically ground); when enabled and activated (with ENABLE and PROGRAM signals, respectively, discussed in more detail below), programming circuit 10 provides a programming current $i_{pr}$ through L1. Also connected to junction 12 and in series with L1 is a current source 14, which provides a "detection current" $i_{det}$ through L1. A threshold detector 16 is connected to junction 12 and compares the voltage across L1 with a reference voltage (or alternatively, compares the current through L1 with a reference current).

A semi-fusible link is characterized as having a first resistance value when intact and a second, higher resistance value when blown, which is transformed between intact and blown states when made to carry predetermined programming current $i_{pr}$.

The current source 14 provides current $i_{det}$ through the link, which results in the voltage at junction 12 (given by $i_{det} \times$ the resistance of L1) being lower when L1 is intact and higher when L1 is blown. This fact is used to determine the state of the link: threshold detector 16 compares the voltage at junction 12 with a reference voltage, and produces a logic output which indicates whether the junction voltage is higher or lower than the reference voltage. Alternatively, the system can be arranged such that threshold detector 16 compares the current through L1 (with a fixed voltage applied across it) with a reference current to produce its logic output.

Though link L1 could itself be used as a circuit element, it is preferably the logic output that is used for parameter trimming. An example of this is shown in FIG. 1, in which an exemplary circuit 17 includes an operational amplifier A1 having an offset trim input TRIM. The trim input is connected to several switching transistors 18, each of which is connected in series with a respective trim resistor $R_{t1}$, $R_{t2}$, $R_{t3}$. Each switching transistor is driven by the logic output of a respective semi-fusible link system 5 (only one of which is shown in FIG. 1). The semi-fusible links in link systems 5 are blown as necessary to establish a desired resistance on A1's trim input. The effects of the trimming operation could be indirectly monitored by observing the change in an analog output signal affected by the trimmed parameter. Alternatively, the logic outputs of respective link systems 5 could be read via respective bond pads, or through a serial interface. It should be noted that the trimmed circuit 17 shown in FIG. 1 is merely exemplary; it is only necessary that the trimmed circuit be configured to respond to a logic output.

Semi-fusible link L1 is preferably a thin film resistor, made from, for example, silicon chromium (SiCr). When made to carry its programming current, the resistor's thin film material is degraded, causing its resistance to change from its intact value (~1k–8k Ω for a SiCr resistor) to its blown value (~20k–80k Ω for SiCr). The resistor is preferably made as short and narrow as possible, to reduce the amount of power required to transform it from its intact to its blown state. Thin film resistor links are preferred because thin film resistors are typically present in analog circuits; as such, no special process steps are required to fabricate the links. In addition, thin film resistors require only a modest amount of programming power to transform, due to the fragility that results from their minimal thickness; this reduces the size requirement of the active device needed to blow the link.

Figure 2:
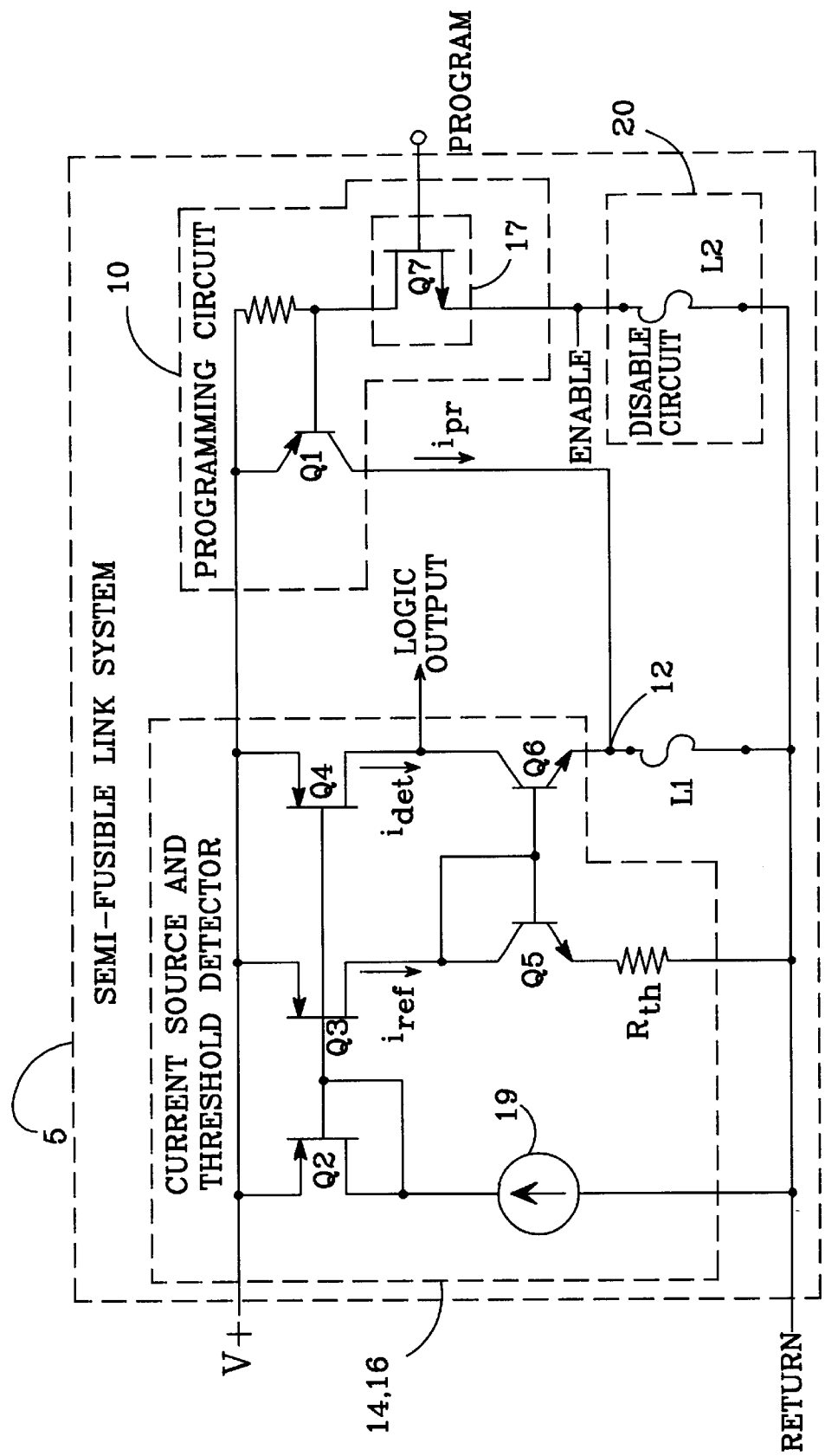
FIG. 2 is a schematic diagram illustrating an exemplary implementation of a semi-fusible link system per the present invention.

One possible implementation of a semi-fusible link system per the present invention is shown in FIG. 2. Programming circuit 10 is made from a transistor Q1, implemented in FIG. 2 with a PNP bipolar transistor having its current circuit connected between V+ and semi-fusible link L1. Programming circuit 10 includes an activation means 17, which operates by pulling down on Q1's base until Q1 turns on and conducts programming current $i_{pr}$ through L1, causing it to transform from its intact to its blown state. A resistor R1 is preferably connected between Q1's base and emitter to ensure that Q1 is only turned on when its base is pulled low. Note that other transistor types, includes NPN and FET transistors, could alternatively be used to provide the necessary programming current.

Current source 14 and threshold detector 16 are economically implemented with a current source 19 and a current mirror consisting of transistors Q2, Q3 and Q4 which mirrors the output of current source 19; Q3 and Q4 produce essentially equal currents $i_{ref}$ and $i_{det}$, respectively. Reference current $i_{ref}$ is connected to a diode-connected transistor Q5, which conducts $i_{ref}$ to the return line via a threshold resistor $R_{th}$. Detection current $i_{det}$ is connected to the current circuit of an output transistor Q6 having its control input connected in common with that of Q5 such that Q5 and Q6 form a current mirror; Q6 conducts $i_{det}$ to the return line via the semi-fusible link L1. The junction of Q6 and Q4 form a comparator output, from which the threshold detector's output (LOGIC OUTPUT) is taken.

The gain of the Q5/Q6 current mirror varies with the ratio of the resistance of link L1 and $R_{th}$. Reference current $i_{ref}$ creates a reference voltage across $R_{th}$, which creates a similar voltage across L1. If the resistance of L1 is less than $R_{th}$, the current in L1 will be greater than that in $R_{th}$, and vice versa. $R_{th}$ is selected such that its resistance is greater than that of the intact L1, but less than that of the blown L1. As a result, when L1 is intact, the current in L1 is greater than that in $R_{th}$, so that Q6 sinks all of the detection current $i_{det}$ and pulls LOGIC OUTPUT down to ground. On the other hand, when L1 is blown, its resistance is increases and its current falls to less than that in $R_{th}$, such that Q6 sinks less than $i_{det}$ and LOGIC OUTPUT rises nearly to V+. Thus, the LOGIC OUTPUT value indicates the state of L1, which can be read by additional circuitry (not shown) as needed.

To minimize the power required to read the state of L1, the threshold voltage (or threshold current) of threshold detector 16 is preferably made as low as possible. This requires that the operation of threshold detector 16 be largely independent of the supply voltage, so that variations in V+ do not affect the detector's threshold level. This is accomplished by, for example, generating a threshold current using a supply-independent voltage source such as a bandgap reference cell. For example, making current source 19 a constant current source, with its output current generated using such a supply-independent voltage source, renders the reference and detection currents $i_{ref}$ and $i_{det}$ produced by Q3 and Q4 largely independent of V+, and enables the power required by the link system to be kept small. However, it is not essential that current source 19 be a constant current source; using a simple circuit such as a resistor for current source 19 would also enable the link system to operate satisfactorily.

As noted above, programming circuit 10 includes activation means 17, which causes $i_{pr}$ to be generated by pulling down on the base of transistor Q1. This is preferably accomplished with a program transistor Q7. The current circuit of Q7 is connected between the base of Q1 and an ENABLE input. The ENABLE input is normally connected to the return line via a low resistance conductive path within a disable circuit 20, such that when Q7 is turned on, a conductive path is provided between the base of Q1 and the return line via Q7 and circuit 20 so that Q1 is turned on. The control input of Q7 preferably receives a PROGRAM signal, which toggles to turn on Q7 and thereby cause semi-fusible link L1 to be blown.

Figure 3:
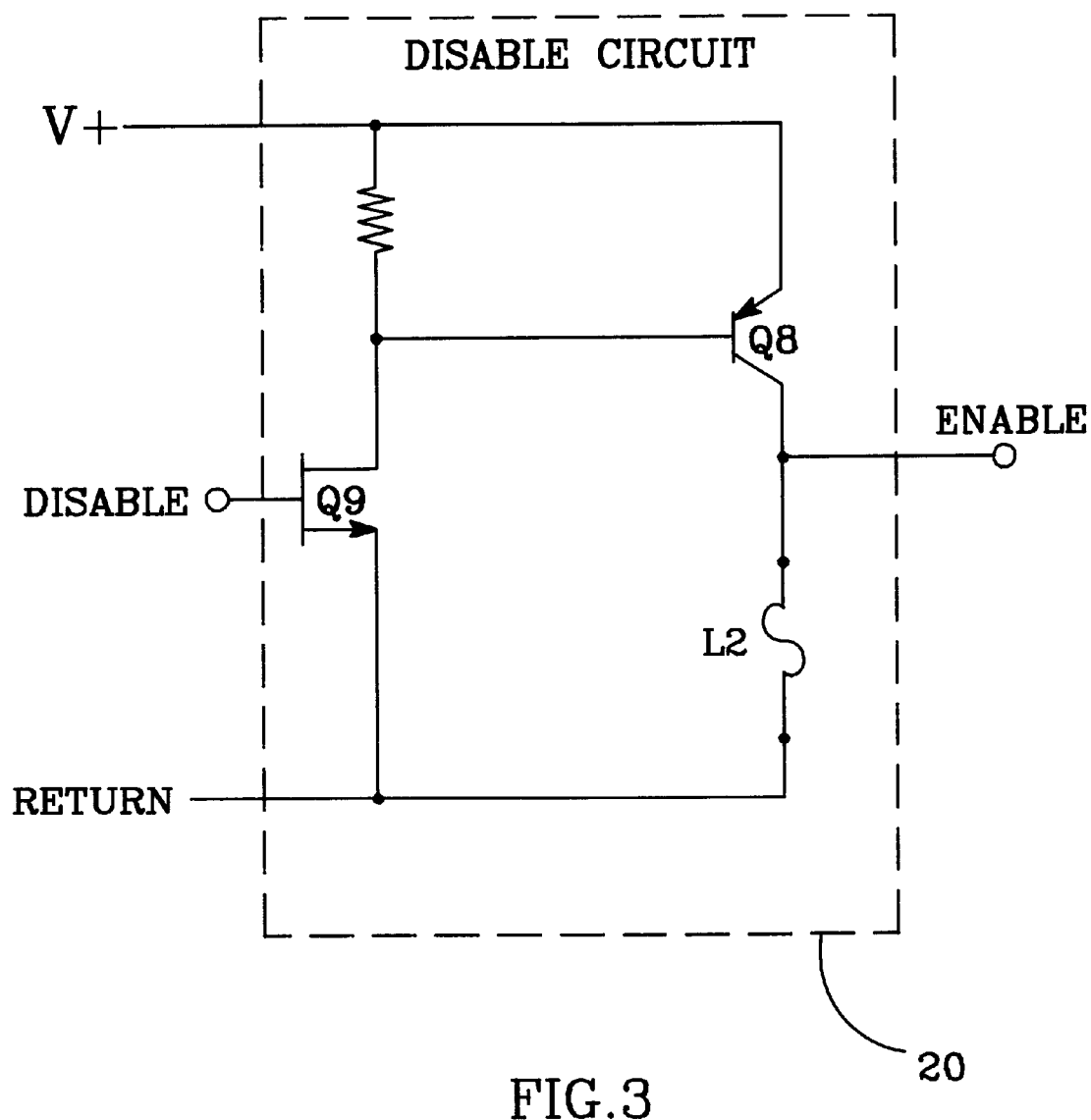
FIG. 3 is a schematic diagram of a disable circuit that might be employed with a semi-fusible link system per the present invention.

By controlling the state of the ENABLE input, the disable circuit provides a means of preventing link L1 from being accidentally blown, which it does by eliminating the low resistance conductive path between the ENABLE input and the return line. One way of accomplishing this is shown in FIG. 3, in which the disable circuit's low resistance conductive path is provided by a semi-fusible link L2. Link L2 is series-connected with the current circuit of a transistor Q8 between V+ and the return line, with the junction between Q8 and L2 serving as the ENABLE input. The control input of Q8 is connected to the current circuit of a "disable" transistor Q9. Q9 is turned on in response to a DISABLE signal received at its control input, which causes Q8 to turn on and supply the programming current necessary to blow L2. Thus, by briefly providing a DISABLE signal to transistor Q9, link L2 is blown, which makes the conductive path between the ENABLE input and the return line a high resistance path. This inhibits the operation of transistor Q1 and prevents the programming current $i_{pr}$ from being provided to L1. A typical circuit incorporating the present invention includes a number of semi-fusible links (each with a respective threshold detector, detection current source, and programming circuit), with each of the programming circuits connected to disable circuit 20. The disable circuit's link L2 is blown after all of the other links have been programmed, preventing those links that were not blown from being blown accidently.

Figure 4:
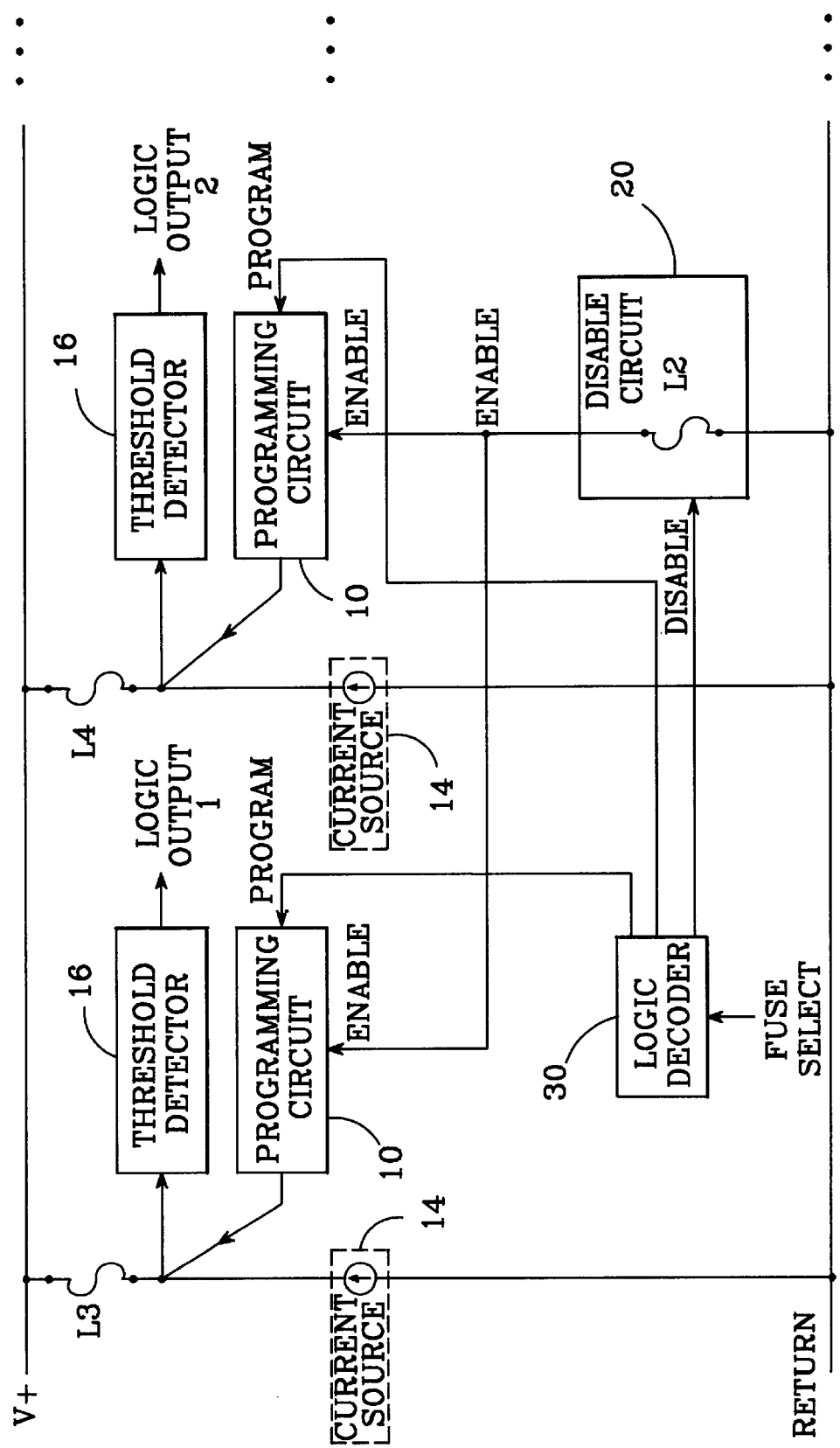
FIG. 4 is a block diagram of a multiple-link programmable semi-fusible link system per the present invention.

A circuit employing a number of semi-fusible link systems is shown in FIG. 4. In this exemplary circuit, two links L3 and L4 are connected in series with respective current sources 14 and respective programming circuits 10, with respective threshold detectors 16 reporting the status of links L3 and L4 via logic outputs LOGIC OUTPUT 1 and LOGIC OUTPUT 2. As noted above, the logic outputs may be connected directly to trimmable circuitry (not shown), or provisions for reading the status of the logic outputs off-chip may be provided. Disable circuit 20 is connected between the ENABLE input of each programming circuit and the return line so that, when the disable circuit's semi-fusible link L2 is blown, none of programming circuits can be activated, and thus no further programming of links L3 and L4 can occur. The programming of the various links in the circuit is preferably controlled with a logic decoder 30, which receives a FUSE SELECT input and provides an output to each of the programming circuits' PROGRAM inputs. The logic decoder is arranged to activate the programming circuits in turn as directed by the FUSE SELECT signal. The FUSE SELECT signal would typically be generated by automated test equipment (ATE) during the circuit fabrication or assembly process, with the ATE possibly also monitoring the logic outputs, as well as the parameter affected by the state of the semi-fusible links.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

I claim:

1. A semi-fusible link system, comprising:
    a semi-fusible link having intact and blown states, said link having a first, non-zero resistance when in said intact state and a second, finite resistance which is higher than said first resistance when in said blown state, said link, when carrying a programming current, is transformed from said intact state to said blown state,
    a programming circuit connected in series with said link which when activated provides said programming current through said link,
    a current source connected to provide a detection current through said link, and
    a threshold detector connected to monitor the voltage across said link and to provide a logic output indicating whether said link is intact or blown based on the magnitude of said link voltage.

2. The link system of claim 1, wherein said semi-fusible link is a thin film resistor.

3. The link system of claim 2, wherein said thin film resistor comprises silicon chromium (SiCr).

4. The link system of claim 1, wherein said link system is connected between a supply voltage and a return line and said detection current source and said threshold detector comprise:
    a current source,
    a current mirror circuit connected to mirror the output of said current source to produce said reference current and said detection current at first and second outputs, respectively,
    a diode-connected transistor having a control input and a current circuit, said current circuit connected between said first current mirror circuit output and a threshold resistor, said diode-connected transistor connected to conduct said reference current from said first current mirror circuit output to said return line via said threshold resistor, and
    an output transistor having a control input and a current circuit, said current circuit connected between said second current mirror circuit output and said link, the control inputs of said diode-connected transistor and said output transistor connected together, said output transistor connected to conduct said detection current from said second current mirror circuit output to said return line via said link, the junction of said output transistor's current circuit and said second current mirror circuit output being the output of said threshold detector, said threshold resistor selected such that when said link is in said intact state said output transistor sinks substantially all of said detection current such that said threshold detector output is pulled toward said return line voltage and when said link is in said blown state said output transistor sinks less than said detection current such that said threshold detector output is pulled toward said supply line voltage.

5. The link system of claim 4, wherein said current source is a constant current source, the output of said constant current source derived from a voltage reference which is substantially independent of variations in said supply voltage.

6. The link system of claim 1, wherein said link system is connected between a supply voltage and a return line and said programming circuit comprises a supply transistor having a control input and a current circuit, said supply transistor's current circuit connected in series between said supply voltage and said link, said programming circuit activated upon receipt of a signal at said supply transistor's control input sufficient to cause said supply transistor to conduct said programming current.

7. The link system of claim 6, further comprising a program transistor having a control input connected to receive a program signal and a current circuit connected between said supply transistor's control input and an enable input, said program transistor arranged to, when said enable input provides a low resistance conductive path to said return line and in response to said program signal, provide said signal at said supply transistor's control input sufficient to cause said supply transistor to conduct said programming current.

8. The link system of claim 7, further comprising a disable link having intact and blown states connected in series between said enable input and said return line, said disable link when in said intact state providing said low resistance conductive path between said enable input and said return line and when in said blown state eliminating said low resistance conductive path such that said program transistor cannot provide said signal at said supply transistor's control input sufficient to cause said supply transistor to conduct said programming current.

9. The link system of claim 8, further comprising a second program transistor and a second supply transistor, said second supply transistor connected to conduct a current through said disable link sufficient to transform said disable link from said intact state to said blown state in response to a signal applied at said second supply transistor's control input by said second program transistor, said second program transistor connected to provide said signal at said second supply transistor's control input in response to a disable signal such that, upon receipt of said disable signal, said disable fuse is blown and said programming current can no longer be supplied to said semi-fusible link.

10. A semi-fusible link system, comprising:
- a plurality of semi-fusible links, each of said links having an intact state and a blown state, each of said links having a first, non-zero resistance when in said intact state and a second, finite resistance which is higher than its first resistance when in said blown state, each of said links when carrying a programming current transformed from its intact state to its blown state,
- a plurality of programming circuits connected in series with respective links, each of said programming circuits when activated providing its respective link's programming current through its respective link,
- a plurality of current sources connected to provide respective detection currents through respective ones of said links, and
- a plurality of threshold detectors connected to monitor respective ones of said detection currents, each of said threshold detectors providing a respective logic output indicating whether its respective link is intact or blown based on the magnitude of said detection current.

11. The link system of claim 10, wherein said semi-fusible links are thin film resistors.

12. The link system of claim 10, further comprising a logic decoder which receives a fuse select signal as an input and is arranged to provide signals to activate respective ones of said programming circuits in response to said fuse select input.

13. The link system of claim 10, further comprising a disable circuit connected to all of said programmer circuits and arranged to when activated prevent the provision of any of said programming currents to their respective links.

14. The link system of claim 10, wherein said link system is connected between a supply voltage and a return line and each of said detection current sources and each of said threshold detectors comprises:
- a current source,
- a current mirror circuit connected to mirror the output of said current source to produce a reference current and said detection current at first and second outputs, respectively,
- a diode-connected transistor having a control input and a current circuit, said current circuit connected between said first current mirror circuit output and a threshold resistor, said diode-connected transistor connected to conduct said reference current from said first current mirror circuit output to said return line via said threshold resistor, and
- an output transistor having a control input and a current circuit, said current circuit connected between said second current mirror circuit output and said link, the control inputs of said diode-connected transistor and said output transistor connected together, said output transistor connected to conduct said detection current from said second current mirror circuit output and said return line via said link, the junction of said current circuit and said second current mirror circuit output being the output of said threshold detector, said threshold resistor selected such that when said link is in said intact state said output transistor sinks substantially all of said detection current such that said threshold detector output is pulled toward said return line voltage and when said link is in said blown state said output transistor sinks less than said detection current such that said threshold detector output is pulled toward said supply line voltage.

15. The link system of claim 10, wherein said link system is powered by a supply voltage and each of said programming circuits comprises a supply transistor having a control input and a current circuit, said supply transistor's current circuit connected in series between said supply voltage and the programming circuit's respective link, each of said programming circuits activated upon receipt of a signal at its supply transistor's control input sufficient to cause said supply transistor to conduct the programming current of the programming circuit's respective link.

16. The link system of claim 15, further comprising a plurality of program transistors having respective control inputs and respective current circuits, each of said program transistors' current circuits connected between the control input of a respective one of said supply transistors and an enable input, each of said program transistors arranged to, when said enable input provides a low resistance conductive path to said return line and in response to said program signal, provide said signal at its supply transistor's control input sufficient to cause said supply transistor to conduct the programming current of the programming circuit's respective link.

17. The link system of claim 16, further comprising a disable link having intact and blown states connected in series between said enable inputs and said return line, said disable link when in said intact state providing a low resistance conductive path between said enable inputs and said return line and when in said blown state eliminating said low resistance conductive path such that said program transistors cannot provide said signals at their respective supply transistors' control inputs sufficient to cause their respective supply transistors to conduct their respective programming currents.

18. The link system of claim 10, further comprising additional circuitry connected to receive at least one of said logic outputs, said additional circuitry having at least one trimmable parameter which is responsive to the state of said at least one logic output.

* * * * *